United States Patent [19]
Pinto et al.

[11] Patent Number: 5,257,294
[45] Date of Patent: Oct. 26, 1993

[54] PHASE-LOCKED LOOP CIRCUIT AND METHOD

[75] Inventors: Victor Pinto, Tel-Aviv; Rafael Fried, Haifa, both of Israel

[73] Assignee: National Semiconductor Corporation, Santa Clara, Calif.

[21] Appl. No.: 614,008

[22] Filed: Nov. 13, 1990

[51] Int. Cl.⁵ ............................................. H03D 3/24
[52] U.S. Cl. ................................... 375/120; 329/325; 331/1 A; 455/183.1
[58] Field of Search ................ 375/119, 120; 329/325; 331/1 A, 10, 179; 455/76, 180.3, 183.1, 188.1

[56] References Cited

U.S. PATENT DOCUMENTS

| | | | |
|---|---|---|---|
| 3,882,412 | 5/1975 | Apple, Jr. | 331/10 |
| 4,434,407 | 2/1984 | Healey, III et al. | 331/10 |
| 4,534,044 | 8/1985 | Funke et al. | 375/120 |
| 4,590,602 | 6/1986 | Wolaver | 375/120 |
| 4,816,774 | 3/1989 | Martin | 331/1 A |
| 4,827,225 | 5/1989 | Lee | 331/10 |
| 4,893,094 | 1/1990 | Herold et al. | 331/1 A |
| 4,931,748 | 6/1990 | McDermott et al. | 331/1 A |
| 5,015,970 | 5/1991 | Williams et al. | 331/1 A |

Primary Examiner—Curtis Kuntz
Assistant Examiner—Young Tse
Attorney, Agent, or Firm—Limbach & Limbach

[57] ABSTRACT

A phase-locked loop circuit and method for producing an output signal which is phase locked with respect to an input signal are disclosed. The circuit includes a phase detector responsive to the phase relationship between the input signal and the output signal. A controlled signal generator, which includes a voltage controlled oscillator, generates the output signal and includes coarse adjust circuitry and fine adjust circuitry. The coarse adjust circuitry causes the frequency of the output signal to fall within one of a selected group of frequency bands in response to the frequency of the input signal. Once the coarse adjustment is made, the fine adjust circuitry continuously changes the frequency and phase of the output signal in response to the phase detector so that the output signal will be phase locked to the input signal.

25 Claims, 6 Drawing Sheets

PHASE-LOCKED LOOP CIRCUIT AND METHOD

BACKGROUND OF THE INVENTION

1. Field of the Invention

The present invention relates generally to phase-locked loop circuits and more particularly to a phase-locked loop circuit having a wide dynamic input range suitable for reducing clock skew.

2. Background Art

In some applications it is necessary to produce a clock having a fixed phase relationship to a reference clock. For example, in fault-tolerant microprocessor systems, two or more microprocessors operate in parallel, each performing the same operation on a clock-by-clock basis (lock-step). One of the microprocessors (the master) interfaces directly with the system, driving all receiving signals. The second microprocessor (the shadow), receives the outputs of the master and checks the outputs each cycle. In this manner, any fault in the master can be detected.

In order to achieve lock-step operation, the skew (phase difference) between the microprocessor clocks, must be minimized and tightly controlled. This tight control must be maintained in the presence of loading requirements that vary among application systems.

It is possible to generate an internal microprocessor clock which is phase locked to an external clock using a conventional phase-locked loop. However, such conventional phase-locked loops are not generally capable of controlling clock skew to one nanosecond ($10^{-9}$ seconds) or below for microprocessor clock frequencies which can range from 5 MHZ to 50 MHz and above.

The present invention is capable of reducing clock skew to less than one nanosecond over a wide range of frequencies. The disclosed phase-locked loop circuit can be readily implemented in integrated circuit form so that it can be incorporated into the clock circuitry of a microprocessor chip and other large systems having high level noise. These and other advantages of the present invention will become apparent to those of ordinary skill in the art upon a reading of the following Detailed Description of the Invention together with the drawings.

SUMMARY OF THE INVENTION

A phase-locked loop circuit for producing an output signal which is phase locked with respect to an input signal and a method of producing an output signal which is phase locked to an input signal are disclosed. The circuit and method are useful, for example, in reducing and controlling skew between an external and an internal microprocessor clock, where the frequency of the external clock may vary over a wide range.

The circuit includes phase detector means for producing a detector output signal in response to a phase difference between the input and output signals. Also included is a controlled signal generating means, for generating the output signal, which includes coarse adjust means and fine adjust means. The coarse adjust means selects the frequency of the output signal from a group of discrete operating frequencies in response to the frequency of the input signal. The fine adjust means is for continuously adjusting the frequency and phase of the output signal in response to the detector output.

The fine adjust means is preferably a voltage controlled oscillator which is responsive to the phase detector output signal. In one embodiment, the coarse adjust means selects the frequency of the output signal by dividing the voltage controlled oscillator output signal by a variable value N, where N is an integer which can vary from 1 through M, with M being an upper limit. The value of N is a function of the frequency of the input signal.

In a second embodiment, the voltage controlled oscillator is a ring oscillator having a plurality of delay stages which can be added to or deleted from the ring oscillator so that the center frequency of the oscillator may be changed. The coarse adjust means functions to either add or delete the delay stages, based upon the frequency of the input signal.

DETAILED DESCRIPTION OF THE INVENTION

Figure 1:
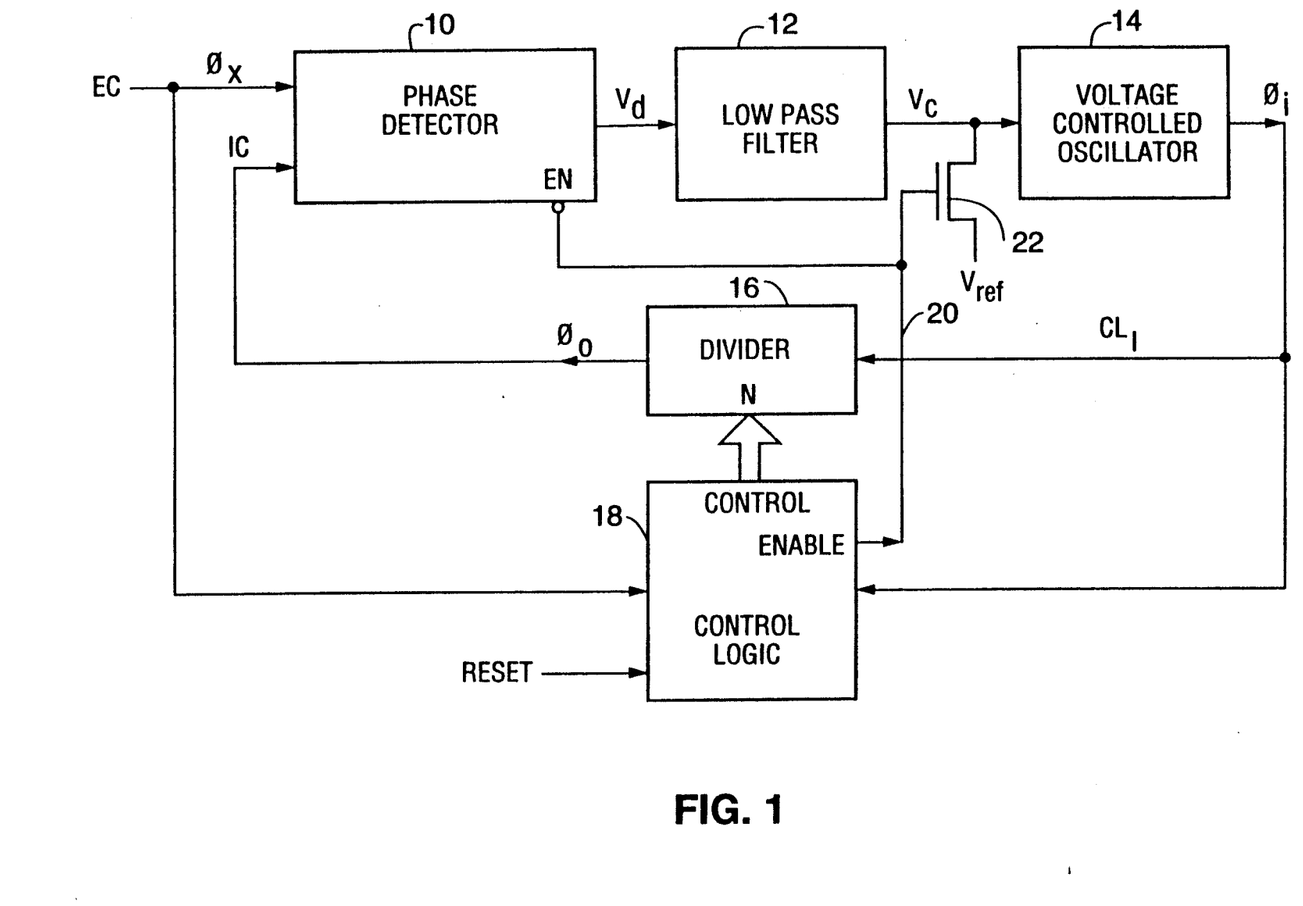
FIG. 1 is a block diagram of a first embodiment phase-locked loop circuit in accordance with the present invention.

Referring now to the drawings, FIG. 1 shows a block diagram of a first embodiment of the present invention. The principal components of the phase-locked loop (PLL) circuit include a phase detector 10, followed by a low pass filter 12. The output of filter 12 is an input to a voltage controlled oscillator (VCO) 14 and the output of VCO 14 is fed back to one of the phase detector 10 inputs by way of a programmable frequency divider 16. Divider 16 is controlled by control logic 18.

The external (input) clock EC is connected to one input of phase detector 10. The remaining input of detector 10 receives an internal clock IC which is produced by the PLL circuit. Clock IC has a fixed phase relationship with the external clock EC. The objective of the FIG. 1 circuit is to limit the skew between the external and internal clocks to a well controlled minimum value over a wide range of external clock EC frequencies.

The output $V_d$ of the phase detector 10 is a function of the phase difference between the two clocks, as follows (the following equation and the other equations disclosed herein are only linear approximations of a phase-locked loop):

$$V_d = K_d(\phi_x - \phi_o) \quad (1)$$

where $V_d$ is the output of the phase detector;
$K_d$ is the gain of the phase detector 10;
$\phi_x$ is the phase of the external clock EC; and
$\phi_o$ is the phase of the internal clock IC.

The output of the low pass filter 12 is a voltage $V_c$ and is as follows:

$$V_c = F(s) V_d \quad (2)$$

where
$V_c$ is the output of the filter;
$V_d$ is the input to the filter; and
$F(s)$ is the transfer function of the filter.

The output $CL_I$ of the voltage controlled oscillator (VCO) 14 has a frequency $f_i$ and phase $\phi_i$ which depend upon the magnitude of control voltage $V_c$. The phase of output $CL_I$ may be expressed as follows:

$$\phi_i = K_c V_c / s \quad (3)$$

where
$\phi_i$ is the phase of output $CL_I$;
$K_c$ is the gain of the VCO; and
s is the Laplace transform variable.

The output $CL_I$ of VCO 14 is connected to the input of the programmable frequency divider 16 which divides the frequency (and phase) of $CL_I$ by a variable integer N. The value of variable N is preferably a power of two and is determined by the control logic 18, as will be explained. The output of divider 16 is the internal clock IC which forms the output of the PLL circuit.

The phase relationship between the VCO output $CL_I$ and the internal clock IC is a follows:

$$\phi_o = \phi_i / N \quad (4)$$

where
$\phi_o$ is the phase of internal clock IC;
$\phi_i$ is the phase of VCO output $CL_I$; and
N is a Variable integer.

Combining equations (1)–(4), it can be seen that the ratio of the phase of the internal clock IC and external clock EC is as follows:

$$\frac{\phi_o}{\phi_x} = \frac{K_d \left[\dfrac{K_c}{N}\right] F(s)}{s + K_d \left[\dfrac{K_c}{N}\right] F(s)} \quad (5)$$

At steady state (s=0) it can be seen from equation (5) that $\phi_o$ will be equal to $\phi_x$.

The value of N is a function of the frequency $f_x$ of the external clock EC. N is determined by the control logic 18 each time the control logic receives the Reset signal (Reset becomes active). This typically occurs at power-up.

The control logic 18 receives the external clock EC and the VCO output $CL_I$. When Reset becomes active, control logic 18 causes an Enable signal on line 20 to go active. This causes the phase detector 10 output to go to an inoperative high output impedance state. This further causes a transistor 22 to become conductive, thereby coupling a reference voltage $V_{REF}$ to the input of VCO 14 in lieu of the phase detector output.

Voltage $V_{REF}$ is selected to fall within the midrange of the control voltage $V_c$. The control logic 18 computes the ratio of the frequency $f_i$ of output $CL_I$ to the unknown frequency $f_x$ of the external clock EC and produces an appropriate value of N. In the present embodiment, N may be any power of 2 ranging from 1 through 64.

Once the value of N has been determined, the value is used to select an appropriate output of divider 16 (divide by 1, 2, 4, etc.). The control logic 18 then causes the Enable signal to go low thereby turning off transistor 22 so that $V_{REF}$ is no longer coupled to the VCO input. Also, phase detector 10 is enabled so that the detector can function.

Figure 2:
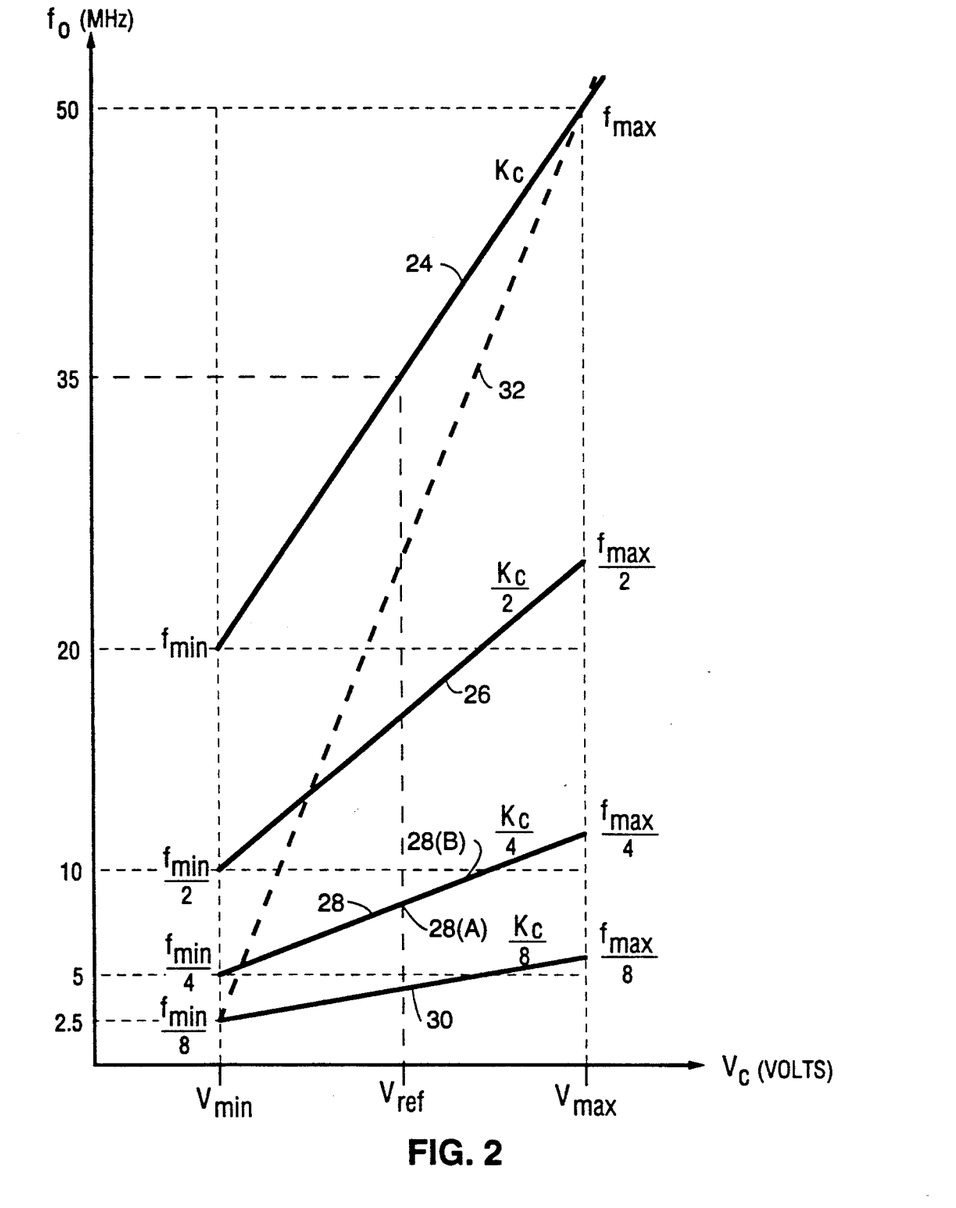
FIG. 2 is a graph showing the frequency versus control voltage $V_c$ characteristics of the voltage controlled oscillator 14 (FIG. 1) of the first embodiment phase-locked loop circuit.

FIG. 2 shows the transfer characteristics of VCO 14 in combination with divider 16 for various values of N. The horizontal axis of the FIG. 2 graph represents the magnitude of the VCO 14 input control voltage $V_c$ and the vertical axis represents the frequency $f_o$ of the internal clock IC (the output of divider 16). By way of example, frequency $f_o$ can range from a maximum value of 50 MHz to a minimum value of less than 1 MHz.

If the input frequency $f_x$ of the external clock EC is in the upper range, the control logic 18 will select a value of N equal to 1. For lower input frequencies, the value of N will be higher.

Figure 3:
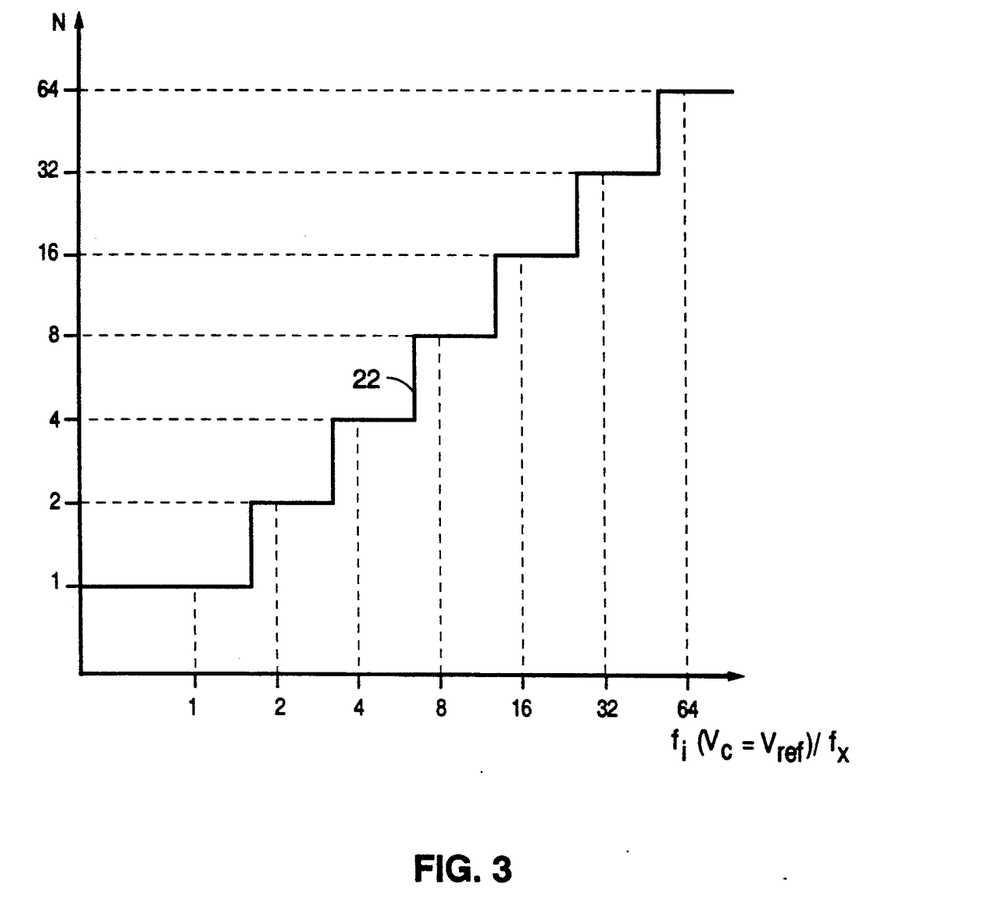
FIG. 3 is a graph showing the relationship between the frequency divider value N and the ratio of the phase-locked loop circuit input frequency and output frequency.

FIG. 3 is a graph illustrating an exemplary algorithm for selecting the value of N. The value is based upon the ratio of the frequency $f_i$ of the VCO output $CL_I$ produced by VCO 14, when the control voltage $V_c$ is forced to $V_{REF}$, to the frequency $f_x$ of the external clock EC. Both the vertical and horizontal axes are logarithmic scale. The vertical axis represents the various values of N and the horizontal axis represents the ratio of the VCO frequency $f_i$ to the external clock EC frequency $f_x$.

Assume that VCO 14 is constructed to produce an output $CL_I$ having a frequency $f_i$ of 35 MHz when $V_c$ is forced to $V_{REF}$. Further assume that the external clock EC has a frequency $f_x$ of 40 MHz. According to the exemplary algorithm plot 22 of FIG. 3, control logic 18 will produce N=1 when the ratio of $f_i$ to $f_x$ is 0.88 (35/40). As a further example, if the input frequency $f_x$ is 9 MHz, the ratio is 3.89 (35/9). In that event, plot 22 indicates that the control logic 18 will produce N=4.

Returning to FIG. 2, curve 24 represents the VCO 14/divider 16 transfer characteristics when N=1. Curves 26, 28 and 30 represent the transfer characteristics when N=2, 4, and 8, respectively. Curves for higher values of N are not depicted.

Figure 4A:
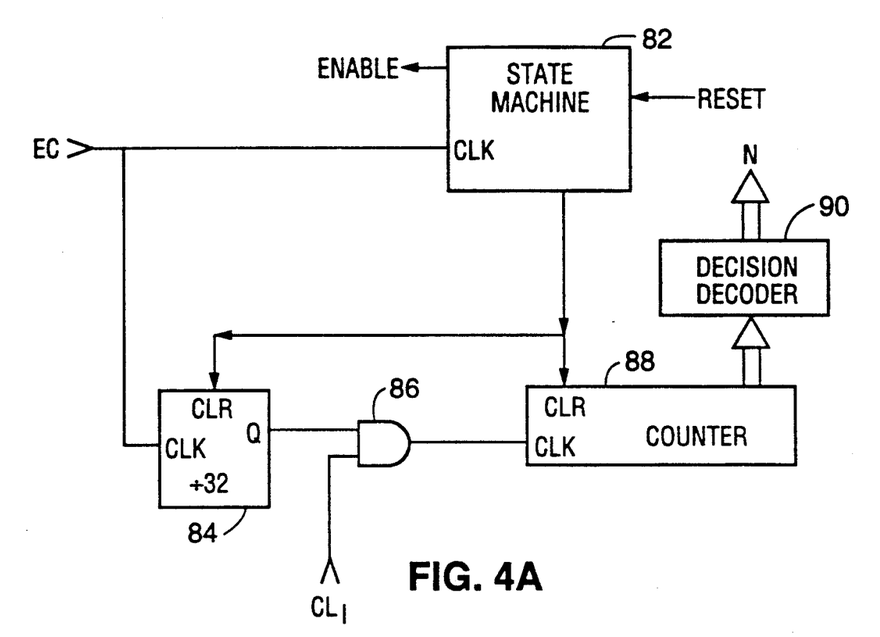
FIG. 4A is a block diagram of the control logic section 18 (FIG. 1) of the first embodiment circuit.
Figure 4B:
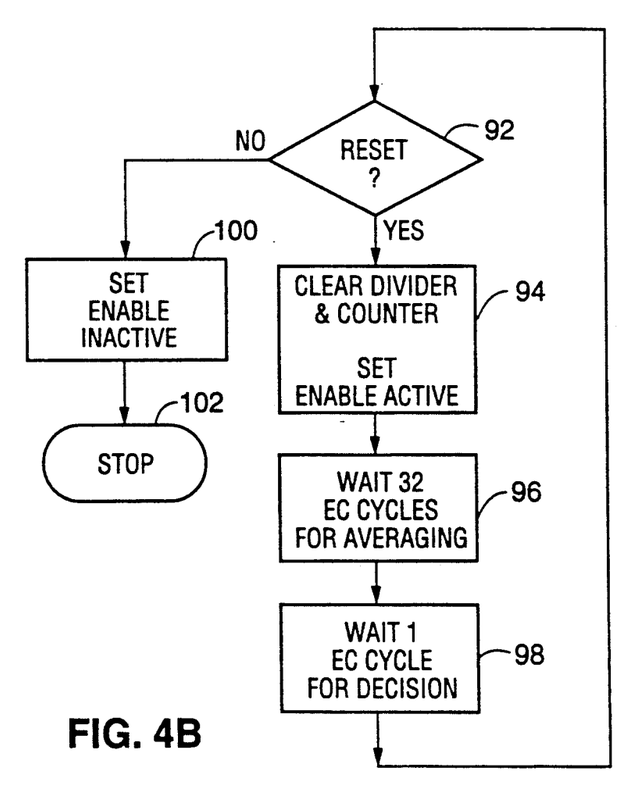
FIG. 4B is a flow chart depicting the operation of the control logic section 18 (FIG. 1) during the phase-locked loop initialization period when the coarse adjust of the loop takes place.

FIG. 4A is a simplified block diagram of the control logic 18 and FIG. 4B is a flow chart illustrating the operation of the control logic during the phase-locked loop reset period. The control logic includes a state machine 82 which receives the Reset signal and the external clock EC. State machine 82 produces the Enable signal and a clear signal which are synchronized with the external clock EC.

The control logic further includes a frequency divider 84 which divides the frequency of the external clock EC by thirty-two. Divider 84 is cleared by the state machine 82. The output of divider 84 is used to enable an AND gate 86. Gate 86 also receives the output of $CL_I$ of the VCO 14 (FIG. 1).

The output of gate 86 is used to clock a counter 88. Counter 88 is also cleared by state machine 82. Counter 88 has eleven output stages which, as will be described, represent the ratio of the frequency $f_i$ of the VCO output $CL_I$ and the frequency $f_x$ of the external clock EC during the coarse adjust period.

The FIG. 4B flow chart depicts the operation of state machine 82 and the associated logic. As represented by element 92, a determination is initially made as to whether the Reset signal is active. If the Reset signal is active, the PLL will be initialized for the purpose of computing the value of N. This will occur, for example, each time the microprocessor is reset in the event the subject circuit is being used in a microprocessor. The PLL reset sequence is of shorter duration than the microprocessor reset sequence since the microprocessor reset sequence requires a functioning internal clock IC.

Assuming that the PLL reset is active, divider 84 and counter 88 are cleared by the state machine, as represented by block 94. In addition, the state machine will produce the Enable signal which will cause voltage $V_{REF}$ to be connected to VCO 14 in lieu of the control voltage $V_c$. Thus, the output of VCO 14 will be forced to a midfrequency value (35 MHz).

Divider 84 produces a counting window having a duration of thirty-two external clock EC cycles. AND gate 86 is enabled during the window period so that several cycles of the VCO output $CL_I$ can be averaged by counter 88. This is depicted by block 96 of the FIG. 4B flow chart. The output of counter 88, therefore, represents the ratio of the frequency $f_I$ of output $CL_I$ to the external clock frequency $f_x$. The weight given to the eleven counter 88 outputs reflects the fact that the averaging period is thirty-two external clock EC cycles.

The counter 88 outputs are coupled to a decision decoder 90 which produces the appropriate value of N in accordance with the FIG. 3 diagram. As indicated by block 98, the state machine waits one external clock EC cycle to enable the decision decoder 90 to produce the appropriate value of N.

The above-described process continues until the PLL initialization has ended and the value of N computed. Once the reset signal goes inactive, (element 92 of FIG. 4B), the Enable signal goes inactive thereby disconnecting the reference voltage $V_{REF}$ from the VCO 14 input and permitting the control voltage $V_c$ to control the oscillator. In addition, the phase detector 10 becomes operative so that the phase-locked loop can proceed to function, with the divider 16 output set to correspond to the computed value of N.

Having described the construction of the first embodiment PLL circuit, operation of the circuit will now be given. Initially, the value of N is selected based upon the frequency $f_x$ of the external clock EC. This can be considered a coarse adjust where the internal clock IC frequency is selected from one of a group of discrete operating frequencies. Once the coarse adjust is completed (Reset inactive), VCO 14 proceeds to function thereby carrying out a fine adjust. The VCO responds to the phase detector 10 and the frequency and phase of the internal clock IC are adjusted continuously so that the clock skew is reduced.

Assume that the input frequency $f_x$ of the external clock EC is 9 MHz. As previously noted, during initialization, the control logic 18 will generate a value of N=4. Accordingly, divider 16 will divide the VCO output $CL_I$ frequency $f_I$ by 4. The output frequency $f_o$ of the divider 16 will, therefore, be at approximately 8.8 MHz (35 MHz/4), as represented by point 28(a) of the FIG. 2 plot 28.

At the end of the initialization, the coarse adjust is completed (N is fixed) and the fine adjust commences. Phase detector 10 is enabled and $V_{REF}$ is disconnected. By operation of negative feedback, the control voltage $V_c$ will begin to increase until the frequency $f_o$ of the divider 16 output, the internal clock IC, is the same frequency as the external clock EC frequency $f_x$, namely, 9 MHz. This is represented by point 28(b) of the FIG. 2 plot 28. At this time, VCO 14 is controlled such that the phase $\phi_x$ of the external clock EC theoretically matches the phase $\phi_o$ of the internal clock.

There will be some phase difference between the two clocks, due primarily to the presence of noise in the system. However, the first embodiment PLL circuit is much more immune to noise than a conventional PLL, as explained below.

Assume that a conventional PLL circuit is used. VCO 14 would have to have a very wide dynamic range in order to accommodate the wide range of input frequencies $f_x$ of the external clock EC. Plot 32 of FIG. 2 shows the transfer characteristics of such a VCO. The slope of the plot, which is the gain $K_c$ of the VCO, must be very steep (high) in comparison to the plots 24, 26, 28 and 30 of the subject invention. Small variations in the control voltage $V_c$ will result in much larger changes in the VCO output frequency. Thus, the high gain VCO is much more susceptible to noise.

The sensitivity of a conventional PLL circuit to noise can be illustrated by the following equation:

$$dT \alpha [T^2 K_{CA}] dV_c \quad (6)$$

where
T is the period of the external clock signal EC;
$K_{CA}$ is the gain of a conventional VCO;
$dV_c$ represents step function noise on control voltage $V_c$; and
dT represents the change in signal period (clock skew) due to noise $dV_c$.

The following equation represents the sensitivity of the first embodiment PLL to noise:

$$dT \alpha \left[ \frac{T^2}{N} K_c \right] dV_c \quad (7)$$

where
N is the variable value used by frequency divider 16;
$K_c$ is the gain of the VCO 14;
T is the period of the external clock EC;
$dV_c$ represents step function noise on control voltage $V_c$; and
dT represents the change in internal clock IC period T (clock skew) due to noise $dV_c$.

In comparing equations (6) and (7), it can be seen that the smaller value of VCO gain of the present invention, $K_C$, in comparison to gain $K_{CA}$ of the conventional PLL, substantially reduces sensitivity to noise. Further, the value of N of equation (7) increases linearly with the period T of the external clock EC. Thus, the magnitude of the clock skew, dT, is linearly dependent on T, whereas the magnitude of the clock skew of the conventional PLL circuit represented by equation (6) is dependent on $T^2$.

As previously noted, the control logic 18 generates the value of N in accordance with the exemplary algorithm plot 22 of FIG. 3. Other algorithms for selecting N could be used. It is important that each curve overlap the adjacent curve. For example, $f_{MAX}/4$ for curve 28 should be selected to exceed $f_{MIN}/2$ for curve 26.

Figure 5:
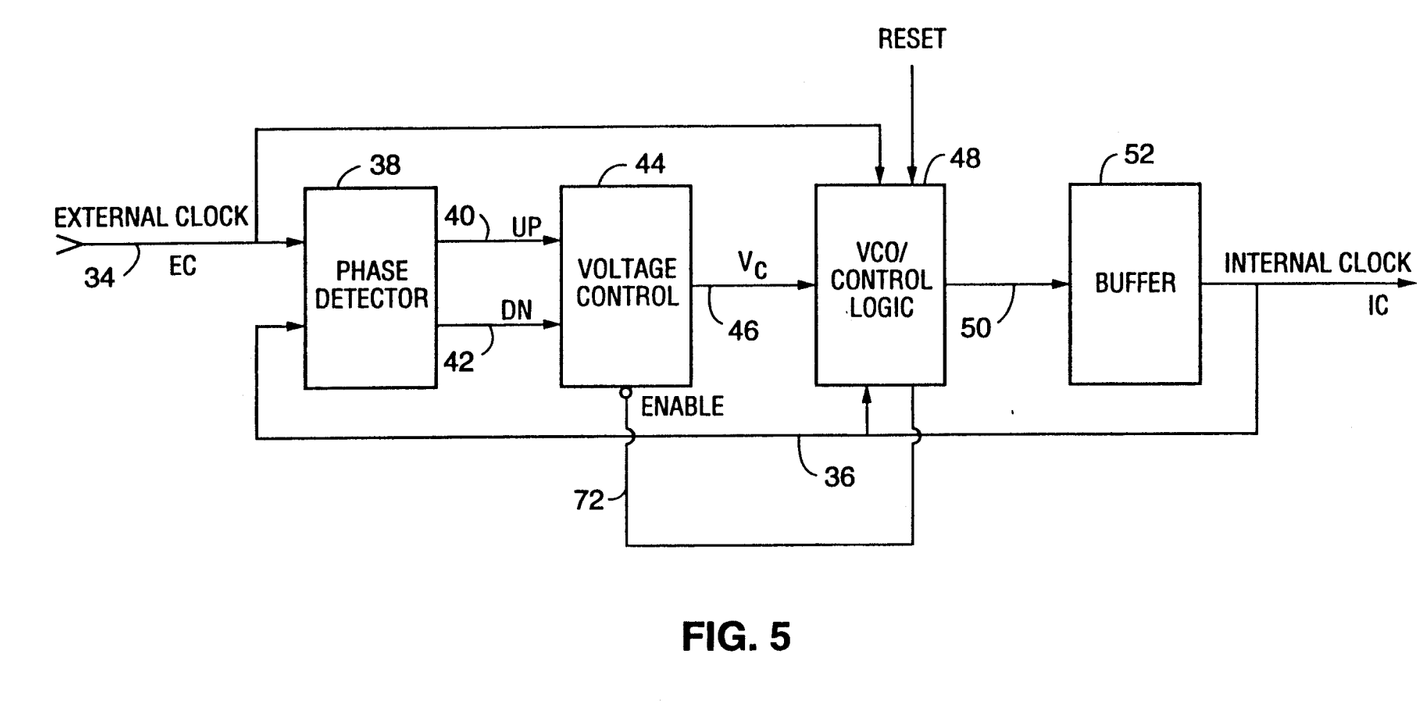
FIG. 5 is a block diagram of an alternative phase-locked loop circuit.

FIG. 5 is an alternative embodiment PLL circuit which can also be used for reducing clock skew. An external clock EC is provided on line 34 and an internal clock IC is produced by the PLL circuit on line 36, with the skew between the two clocks being maintained at a small, controlled value.

The PLL circuit includes a phase detector 38 which receives the external clock EC and the internal clock IC. Detector 38 detects the difference in phase between the two clocks and generates digital control signals UP, on line 40, and DN, on line 42, depending upon the polarity of the relative phase difference. If clock IC lags behind clock EC, output UP is active. Similarly, if clock EC lags behind IC, output DN is active.

The control signals UP and DN are coupled to a voltage control block 44 which generates a control voltage $V_c$ on line 46. Control voltage $V_c$ varies, according to signals UP and DN, such that the voltage reflects the phase difference between clocks EC and IC.

Control voltage $V_c$ is fed into a VCO/Control Logic block 48, as is the external clock EC and the internal clock IC. In addition, a Reset signal is coupled to block 48. As will be described in greater detail, the VCO of block 48 produces an output signal having a frequency and phase which varies with the control voltage Vc, external clock EC and internal clock IC. Generally, the frequency of the VCO is initially adjusted based upon the frequency of the external clock EC. This is a coarse adjust wherein one of a plurality of VCO frequency operating bands is selected. Once the initial coarse frequency setting has been made, the final frequency and phase of the VCO output are controlled by control voltage Vc in a continuous manner. This is the fine adjust.

The VCO output on line 50 is buffered by circuit 51 which is capable of driving a large number of clock inputs (not depicted). These clock inputs may be, for example, various internal clock inputs of a microprocessor.

Figure 6:
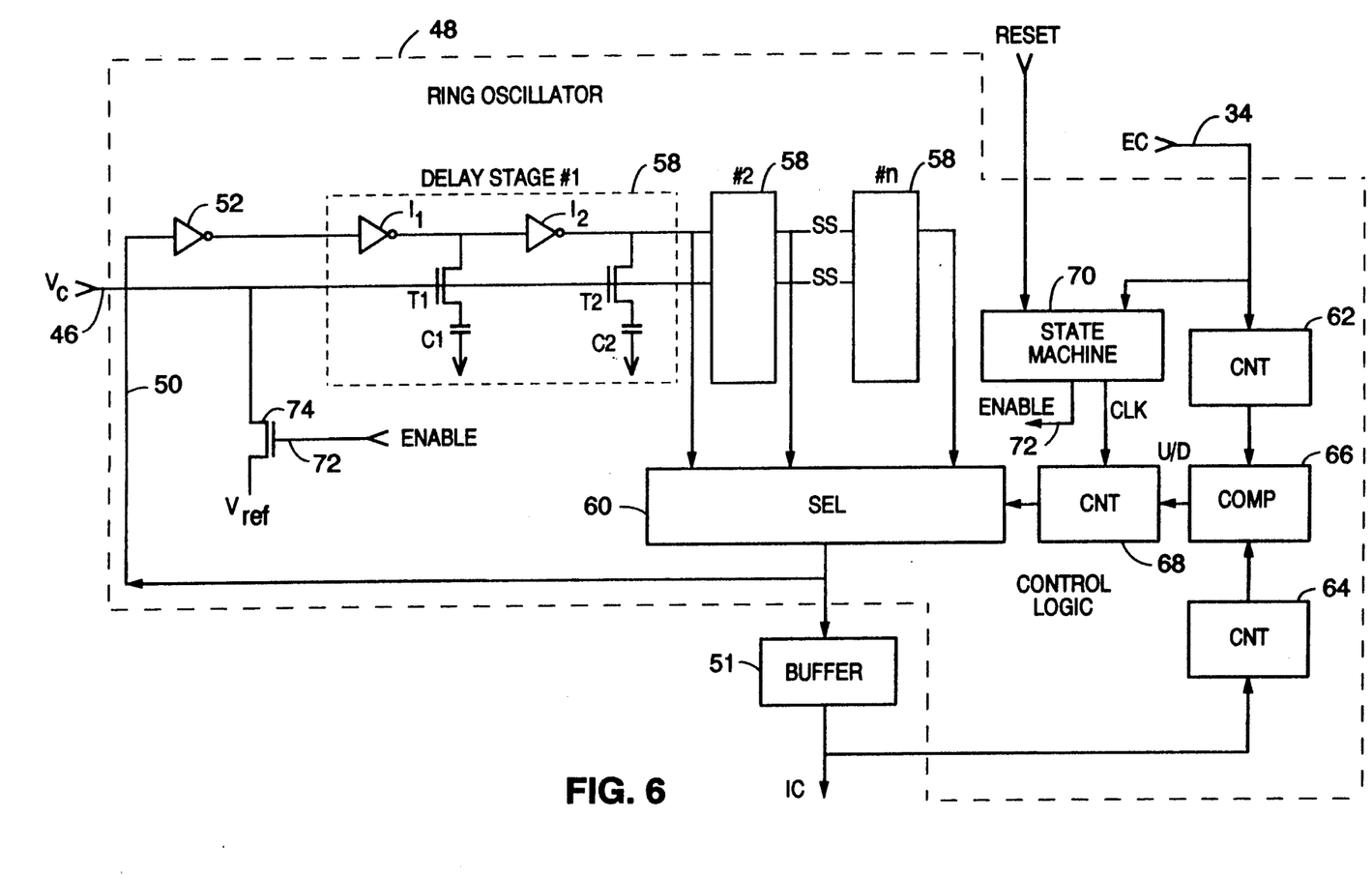
FIG. 6 is a more detailed diagram of the voltage controlled oscillator and the associated control logic of the FIG. 5 embodiment.

The details of the construction of VCO/Control Logic 48 are shown in FIG. 6. The VCO includes a ring oscillator and associated control logic. The ring oscillator has an input in the form of an inverter 52 which receives the output of the VCO on line 50.

The output of inverter 52 is coupled to the first stage of a plurality of identical ring oscillator delay stages 58, 1 through n. Each delay stage 58 includes two inverters $I_1$ and $I_2$ connected in series. The output of the first inverter $I_1$ is connected to a capacitor $C_1$ by way of an MOS transistor $T_1$. Similarly, the output of inverter $I_2$ is connected to a capacitor $C_2$ by way of a MOS transistor $T_2$.

The gates of transistors $T_1$ and $T_2$ are also connected in common to line 46 which receives the control voltage $V_c$. Accordingly, the delay provided by each delay stage 1 through n is a function of the control voltage magnitude Vc.

The output of each delay stage 58 is connected to a selector circuit 60 which includes a multiplexer (not depicted) for coupling a selected one of the delay stage 58 outputs back to the input of inverter 52. Since there are always an odd number of inverters, the feedback will be positive, thereby providing the desired oscillation. The frequency of the ring oscillator can be varied in discrete steps by adding or deleting delay stages in the feedback loop. The maximum frequency is achieved by feeding back the output of the first delay stage and the minimum frequency is achieved by feeding back the output of the last delay stage n.

The number of selected delay stages 58 is determined by the control logic, as will be described. The external clock EC on line 34 is fed to the input of a first counter 62. The internal clock IC from buffer 51 is fed to the input of a second counter 64. The outputs of counters 62 and 64 are fed to respective inputs of a digital comparator 66. The outputs of the two counters are compared after a predetermined time period. Output signal U/D of the comparator indicates the relative magnitude of the frequency of clocks EC and IC.

Signal U/D controls the state of an up/down counter 68 which is either incremented or decremented by a clock produced by a state machine 70, depending upon the level of signal U/D. The selector circuit 60 includes decode logic (not depicted) which decodes the output of counter 68 and selects a particular delay stage 58 output to be fed back to the oscillator input on line 50.

The state machine 70 is similar in function to the state machine 82 of the first embodiment circuit. Machine 70 receives the PLL Reset signal and the external clock EC. The machine then produces various signals, including the Enable signal on line 72, the clock for up/down counter 68, signals for clearing counters 62 and 64 and signals for controlling the counting window for counters 62 and 64.

Initially, the state machine determines whether the Reset signal is active. If active, the Enable signal is produced on line 72. The Enable signal causes transistor 74 to be conductive thereby coupling the voltage reference $V_{REF}$ to the control input of the VCO on line 46. Preferably, $V_{REF}$ is selected to fall within the midrange of the control voltage $V_c$. In addition, the Enable signal also disables the voltage control block 44 (FIG. 4) so that the output of the block becomes disabled (a high impedance). Accordingly, $V_{REF}$ is applied to VCO 48 in lieu of the control voltage $V_c$.

The state machine 70 clears counters 62 and 64 and permits the counters to be clocked by the external clock EC and the internal clock IC, respectively. The duration of the counting period is also controlled by the state machine, as previously noted.

After a predetermined time period, the contents of counters 62 and 64 are compared by comparator 66. Assuming that the external clock EC frequency is greater than the frequency of the internal clock IC, the count in counter 62 will exceed that of counter 64. Accordingly, the comparator output U/D will cause counter 68 to be in a decrement mode. Machine 70 will then produce one clock pulse and counter 68 will be decremented by one count. This will cause the selector circuit 60 to remove a delay stage so that the VCO frequency will increase by one discrete step as will the frequency of the internal clock IC.

The above-described process continues until an appropriate number of delay stages are selected. At this point, the VCO frequency (the internal clock IC frequency), roughly matches the frequency of the external clock EC. This initialization step is equivalent to a coarse adjust of the VCO.

After the initial coarse adjust period is completed, the Reset signal becomes inactive followed by the Enable signal. This causes the reference voltage $V_{REF}$ to be disconnected and the voltage control block 44 to be enabled. At this time, voltage $V_c$ will change magnitude, either increasing or decreasing the gate voltage of transistors $T_1$ and $T_2$ of the delay stages. An increase in control voltage will cause the transistors to become more conductive thereby increasing the effective load capacitance. Thus, the frequency of the VCO will decrease. Conversely, a decrease in control voltage $V_c$ will cause the transistors to become less conductive, thereby reducing the effective load capacitance and increasing the frequency of the VCO output.

The value of $V_c$ changes until the frequency and phase of the internal clock IC match that of the external clock EC. During this fine adjust period, the frequency and phase of clock IC will be continuously varied to match that of external clock EC. Thus, the skew between clocks EC and IC is reduced to a minimum value and closely controlled.

VCO 48 has a very wide dynamic range which can accommodate a wide range of external clock EC frequencies. In most applications, however, the first embodiment PLL circuit (FIG. 1) is preferred because immunity to noise present on the control voltage $V_c$ has been found to be higher in practice.

Thus, two embodiments of a phase-locked loop circuit suitable for reducing clock skew have been disclosed. Although these embodiments have been described in some detail, it is to be understood that various changes can be made by those skilled in the art without departing from the spirit and scope of the invention as defined by the appended claims.

We claim:

1. A phase-locked loop circuit for producing an output signal which is phase locked with respect to an input signal, said phase-locked loop circuit comprising:
   phase detector means for producing a detector output in response to a phase difference between the input and output signals;
   controlled signal generating means for generating the output signal, said controlled signal generating means including:
   (a) coarse adjust means for selecting the frequency of the output signal from a group of discrete operating frequencies in response to the frequency of the input signal and independent of said phase detector means; and
   (b) fine adjust means for continuously adjusting the frequency and phase of the output signal in response to the detector output.

2. The phase-locked loop circuit of claim 1 wherein the coarse adjust means includes:
   frequency comparison means for comparing the frequency of the input signal with the frequency a signal produced by the controlled signal generating means; and
   control means for selecting the frequency of the output signal in response to the frequency comparison means.

3. The phase-locked loop circuit of claim 2 wherein the fine adjust means includes controlled oscillator means responsive to the detector output for generating an oscillator output signal.

4. The phase-locked loop circuit of claim 3 wherein the coarse adjust means includes frequency dividing means for dividing the frequency of the oscillator output signal by a variable value to produce a frequency divided signal.

5. The phase-locked loop circuit of claim 4 wherein the variable value is an integer N, where N may vary from 1 through M, and where M is an upper limit.

6. The phase-locked loop circuit of claim 5 wherein the frequency divided signal corresponds to the output signal.

7. The phase-locked loop circuit of claim 5 wherein the controlled oscillator means is also responsive to a reference signal and wherein the control means further includes initialization means for temporarily coupling the reference signal to the controlled oscillator means.

8. The phase-locked loop circuit of claim 7 wherein the frequency divider means includes logic means for calculating the value of N when the initialization means couples the reference signal to the controlled oscillator means.

9. The phase-locked loop circuit of claim 3 wherein the controlled oscillator means is also a means for changing the frequency of the oscillator output signal in discrete steps in response to a control signal.

10. The phase-locked loop circuit of claim 9 wherein the control means produces the control signal.

11. The phase-locked loop circuit of claim 10 wherein the controlled oscillator means includes a ring oscillator comprising a plurality of delay stages which may be added to or deleted from the ring oscillator in response to the control signal, thereby changing the frequency of the output signal in discrete steps.

12. The phase-locked loop circuit of claim 11 wherein the delay stages each includes at least one inverter circuit and associated capacitive load.

13. The phase-locked loop circuit of claim 11 wherein the output of the inverter circuit of the delay stages is coupled to the associated capacitive load through a transistor, with the transistor having a control electrode coupled to detector output.

14. The phase-locked loop circuit of claim 13 wherein the delay stage transistors are coupled to the detector output through a low pass filter.

15. A phase-locked loop circuit for providing an output signal which is phase locked with respect to an input signal, said phase-locked loop circuit comprising:
   phase detector means for producing a detector output indicative of a difference in phase between the input and output signals;
   controlled oscillator means for producing an oscillator output signal in response to the detector output signal;
   frequency divider means for dividing the frequency of the oscillator output signal by a variable value to produce the output signal; and
   control means for determining the frequency divider means variable value based upon the frequency of the input signal and independent of the phase detector means.

16. The phase-locked loop of claim 15 wherein the variable value is an integer N, where N may vary from 1 through M, and where M is an upper limit.

17. The phase-locked loop of claim 16 wherein the controlled oscillator means is also responsive to a reference signal and where the control means further includes initialization means for temporarily coupling the reference signal to the controlled oscillator means for the purpose of determining the variable value.

18. A phase-locked loop circuit for providing an output signal which is phase locked with respect to an input signal, said phase-locked loop circuit comprising:
   phase detector means for producing a detector output indicative of a difference in phase between the input and output signals;
   controlled oscillator means for producing an oscillator output signal in response to the detector output signal, with the output signal having a plurality of different operating frequencies selected in response to a control signal separate from the detector output signal; and control means for producing the control signal in response to the frequency of the input signal and independent of the phase of the input signal.

19. The phase-locked loop of claim 18 wherein the controlled oscillator means includes a ring oscillator comprising a plurality of delay stages which may be added to or deleted from the ring oscillator in response to the control signal.

20. A method of producing an output signal which is phased locked to an input signal comprising the following steps:

selecting one of a plurality of frequency operating bands based upon the frequency of the input signal and independent of the phase of the input signal;

generating the output signal in the selected frequency operating band;

comparing the phase relationship between the generated output signal and the input signal; and controlling the phase of the generated output signal based upon the step of comparing.

21. The method of claim 20 wherein the step of generating the output signal includes the step of generating an intermediate operating signal and dividing the frequency of the intermediate operating signal by a variable value, with the variable value determined in the selecting step.

22. The method of claim 21 wherein the step of selecting the frequency operating band includes the step of comparing the frequency of the input signal with the frequency of the intermediate operating signal.

23. The method of claim 22 wherein the step of generating an intermediate operating signal is carried out utilizing a controlled oscillator responsive to a control signal and the step of controlling the phase of the generated output signal is carried out by varying the control signal.

24. The method of claim 23 wherein the step of selecting one of a plurality of frequency operating bands includes the step of applying a predetermined control signal to the controlled oscillator.

25. The method of claim 20 wherein the step of generating the output signal is carried out utilizing a ring oscillator defining a feedback loop which includes a plurality of delay stages which can be added to and deleted from the feedback loop and the step of generating the output signal includes the step of adding or deleting the delay stages.

* * * * *